(12) United States Patent
Tan et al.

(10) Patent No.: US 10,079,474 B2
(45) Date of Patent: Sep. 18, 2018

(54) SINGLE MODE VERTICAL-CAVITY SURFACE-EMITTING LASER

(71) Applicant: HEWLETT PACKARD ENTERPRISE DEVELOPMENT LP, Houston, TX (US)

(72) Inventors: Michael Renne Ty Tan, Menlo Park, CA (US); Wayne V Sorin, Mountain View, CA (US); Sagi V Mathai, Sunnyvale, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/329,594

(22) PCT Filed: Sep. 22, 2014

(86) PCT No.: PCT/US2014/056790
§ 371 (c)(1),
(2) Date: Jan. 27, 2017

(87) PCT Pub. No.: WO2016/048268
PCT Pub. Date: Mar. 31, 2016

(65) Prior Publication Data
US 2017/0214218 A1  Jul. 27, 2017

(51) Int. Cl.
*H01S 5/00* (2006.01)
*H01S 5/183* (2006.01)
(Continued)

(52) U.S. Cl.
CPC ........ *H01S 5/18311* (2013.01); *H01S 5/0207* (2013.01); *H01S 5/0267* (2013.01);
(Continued)

(58) Field of Classification Search
CPC .. H01S 5/18311; H01S 5/0267; H01S 5/0207; H01S 5/18377; H01S 5/18319;
(Continued)

(56) References Cited

U.S. PATENT DOCUMENTS 6,021,147 A * 2/2000 Jiang ............... H01S 5/183
372/50.11
6,343,090 B1 1/2002 Yoo et al.
(Continued)

FOREIGN PATENT DOCUMENTS

WO     WO-0193387 A2    12/2001

OTHER PUBLICATIONS

International Search Report & Written Opinion received in PCT Application No. PCT/US2014/056790, dated Jun. 19, 2015, 11 pages.
(Continued)

*Primary Examiner* — Yuanda Zhang
(74) *Attorney, Agent, or Firm* — Hewlett Packard Enterprise Patent Department (57) ABSTRACT

A vertical-cavity surface-emitting laser (VCSEL) includes first reflector having a first reflectivity; a second reflector having a second reflectivity, where the second reflectivity is less than the first reflectivity; a gain region between the first and second reflectors; and a substrate having a first surface and a second surface, where the first surface is coupled to the second reflector, and where the second surface is formed into a lens to act upon light emitted the VCSEL through the substrate. The VCSEL lases in a single transverse mode.

10 Claims, 8 Drawing Sheets

(51) Int. Cl.
*H01S 5/02* (2006.01)
*H01S 5/026* (2006.01)

(52) U.S. Cl.
CPC ...... *H01S 5/18319* (2013.01); *H01S 5/18344* (2013.01); *H01S 5/18377* (2013.01); *H01S 5/18394* (2013.01); *H01S 2301/166* (2013.01)

(58) Field of Classification Search
CPC ............. H01S 5/18344; H01S 5/18394; H01S 2301/166
See application file for complete search history.

(56) References Cited

U.S. PATENT DOCUMENTS

| | | | |
|---|---|---|---|
| 8,031,752 B1* | 10/2011 | Johnson | H01S 5/18358 372/43.01 |
| 8,073,035 B2 | 12/2011 | Takeuchi | |
| 8,290,009 B2 | 10/2012 | Masui et al. | |
| 8,824,520 B2* | 9/2014 | Kondo | H01S 5/18358 372/45.01 |
| 2002/0093024 A1 | 7/2002 | Lee et al. | |
| 2002/0181536 A1* | 12/2002 | Jeon | H01S 5/18388 372/96 |
| 2005/0025211 A1 | 2/2005 | Zhang et al. | |
| 2007/0014324 A1* | 1/2007 | Maeda | H01S 5/18391 372/46.01 |
| 2011/0182316 A1 | 7/2011 | Kondo et al. | |
| 2011/0280269 A1* | 11/2011 | Chang-Hasnain | B82Y 20/00 372/50.1 |
| 2012/0008658 A1 | 1/2012 | Chung | |
| 2013/0177336 A1* | 7/2013 | Ikuta | B41J 2/455 399/221 |
| 2013/0195135 A1 | 8/2013 | Uchida et al. | |
| 2014/0023102 A1 | 1/2014 | Holder et al. | |
| 2014/0112364 A1 | 4/2014 | Kondo et al. | |

OTHER PUBLICATIONS

Schablitsky, S.J., "Controlling Polarization of Vertical-Cavity Surface-Emitting Lasers Using Amorphous Silicon Subwavelength Transmission Gratings," Applied Physics Letters, 69.1, 1996, pp. 7-9, www.princeton.edu/~chouweb/publications/68%20Schablitsky_Controlling%20Polization%20Transmission%20Gratings_APL_1996, pp. 7-9.

* cited by examiner

SINGLE MODE VERTICAL-CAVITY SURFACE-EMITTING LASER

BACKGROUND

An oxide-confined vertical-cavity surface-emitting laser (VCSEL) has a PIN diode structure with high reflectivity top and bottom mirrors and an oxide aperture. The standard VCSEL operates in multiple transverse modes.

BRIEF DESCRIPTION OF THE DRAWINGS

The accompanying drawings illustrate various examples of the principles described below. The examples and drawings are illustrative rather than limiting and may not be to scale.

DETAILED DESCRIPTION

When the output of VCSELs operating in multiple transverse modes is coupled to an optical fiber, different modes are excited in the fiber that travel at different velocities. As a result, the link distance is limited, particularly at high data rates, such as 40 gigabits per second. However, for a VCSEL operating in a single transverse mode, that single mode couples to fewer fiber modes, thus reducing the impact of modal dispersion.

Back emitting VCSEL devices that operate in a single transverse mode are described below. Various configurations with different modifications to the reflectivity of the reflector that does not emit the lasing light are described below. In general, the VCSEL has a first reflector having a first reflectivity; a second reflector having a second reflectivity, where the second reflectivity is less than the first reflectivity; and a light generation region between the first and second reflectors. The VCSEL also has a substrate with a first surface and a second surface, where the first surface is coupled to the second reflector, and the second surface is formed into a lens shape (an integrated lens) to act upon light emitted by the VCSEL through the substrate. Additionally, the VCSEL has an oxide layer having an aperture with an aperture diameter in a central area of the oxide layer, where the aperture in the oxide layer has a higher refractive index than the surrounding oxide layer. The oxide layer is located at or near a null of a standing wave in the VCSEL structure, and a center of the oxide layer is approximately aligned with a central axis of the first reflector, the light generation region, the second reflector, and the substrate.

Moreover, the VCSEL can include a high contrast grating positioned over the central region of the first reflector, where the first reflector comprises multiple pairs of semiconductor layers forming a distributed Bragg reflector, and where a diameter of the high contrast grating is less than the aperture diameter.

Further, the VCSEL can include a radially-dependent mesa layer above the first reflector having a central point aligned with the central axis, where the radially-dependent mesa layer comprises at least one of a dielectric material, a transparent conductive oxide, a transparent conductive nitride, or a polymer, where the radially-dependent mesa layer has a first thickness that is approximately a quarter of the VCSEL lasing wavelength within a first region having a first diameter around the central axis, and the radially-dependent mesa layer has a second thickness that is approximately half of the VCSEL lasing wavelength in a second region surrounding the first region. The first reflector comprises multiple pairs of semiconductor layers forming a distributed Bragg reflector, and the first diameter of the first region is less than the aperture diameter.

In some instances, the first reflector can be a distributed Bragg reflector and comprise a first number of pairs of semiconductor layers in a central region of the first reflector and a second number of pairs of semiconductor layers in an outer region surrounding the central region, where the first number of pairs is greater than the second number of pairs, and further where the central portion has a reflector diameter less than the aperture diameter, and the central portion has a higher reflectivity than the outer region surrounding the central region.

Figure 1:
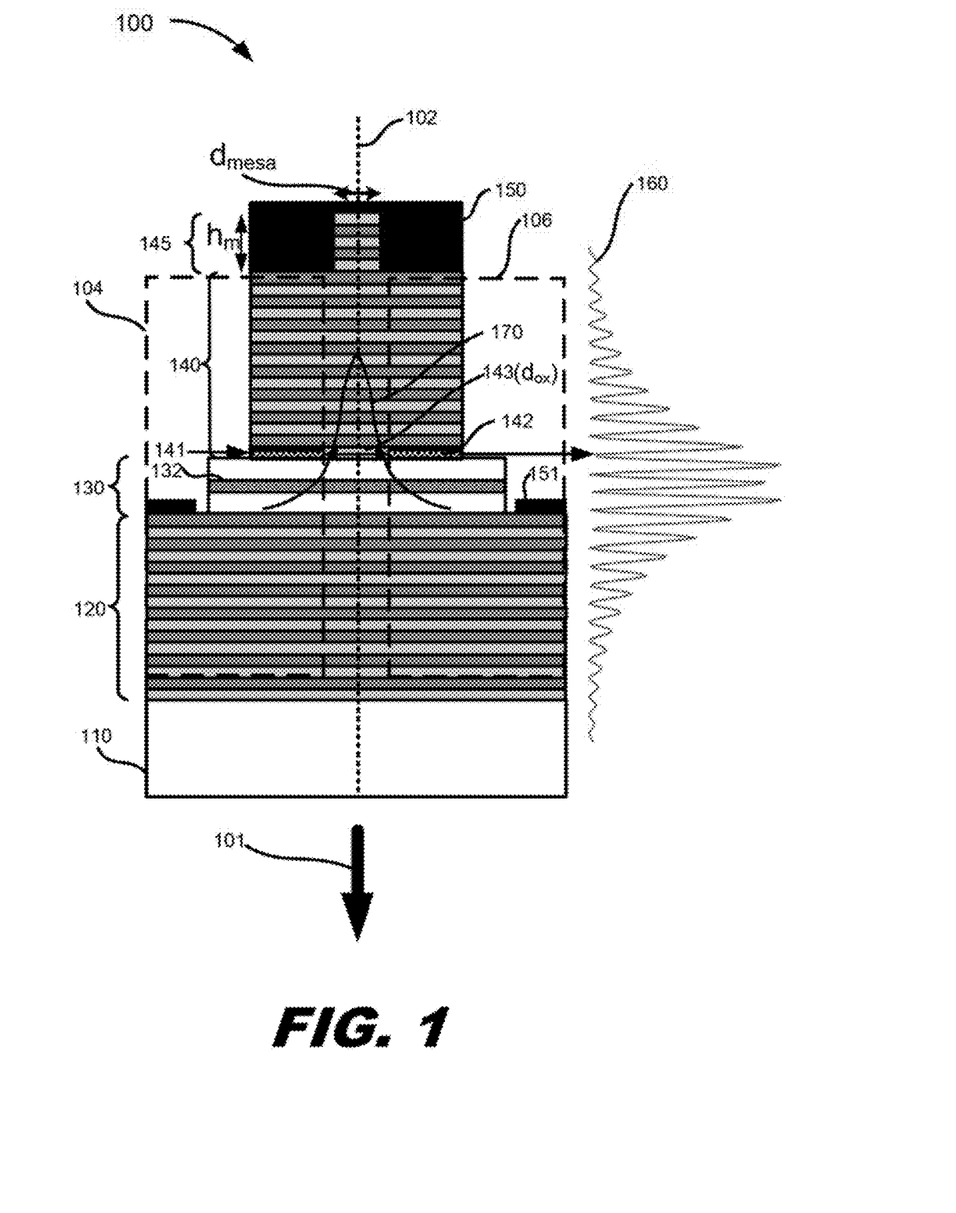
FIG. 1 depicts a cross-sectional view of an example single transverse mode VCSEL, according to one implementation of the disclosure.

FIG. 1 depicts a cross-sectional view of an example single transverse mode VCSEL 100, according to one implementation of the disclosure. The VCSEL 100 has a first reflector 140 having a first reflectivity and a second reflector 120 having a second reflectivity. Both the first reflector 140 and the second reflector 120 are distributed Bragg reflectors (DBRs) formed from alternating layers or pairs of two different semiconductor materials, where the optical thickness of each layer is one quarter of the lasing wavelength. The first reflector 140 is p-doped, and the second reflector 120 is n-doped, and the two different semiconductor materials have different indices of refraction. In alternate embodiments, the first reflector 140 is n-doped, and the second reflector 120 is p-doped. The substrate 110 may p-doped, n-doped, or semi-insulating.

The second reflector 120 is fabricated on top of a substrate 110. Between the first reflector 140 and the second reflector 120 is a one wavelength thick cavity 130 that has a light generating multiple quantum well (MQW) gain region 132 within. The MOW gain region 132 is positioned at the peak of a standing wave 160 in the cavity in the VCSEL. The second reflectivity of the second reflector 120 is less than the first reflectivity of the first reflector 140, thus the VCSEL emits light through the second reflector 120 in a direction indicated by the arrow 101. While directional words, such as top and over, are used in the description to indicate relative locations with respect to the orientation of the VCSEL structure shown in the figures, the actual VCSEL structure can be oriented in any direction.

Additionally, the VCSEL 100 has a semiconductor layer 141 that contains aluminum, such as Al(x)Ga(y)As, and part of the semiconductor layer is converted into an insulating layer by exposing the semiconductor layer to a water vapor environment. Water vapor enters the semiconductor layer 141 from the edges and moves toward the middle of the layer so that an outside portion of the Al(x)Ga(y)As layer is converted into an AlO layer 142. A central area in the middle of the Al(x)O(y) layer 142, along a central axis 102 of the VCSEL 100, is left unoxidized, to leave an oxide aperture 143 in the semiconductor layer 141 surrounding the central axis 102. The oxide aperture 143 has a diameter $d_{ox}$. The Al(x)O(y) material has a lower index of refraction than the Al(X)Ga(y)As material. Thus, there is effectively a lower index region 104, 106 surrounding the central oxide aperture 143. The index difference between the lower index regions 104, 106 and the oxide aperture 143 contributes to the optical confinement of the mode 170 in the VCSEL. The insulating oxide 142 blocks the current within the VCSEL 100, while the oxide aperture 143 allows the current to pass. The oxide layer 142 should be positioned at or near a null or node of the standing wave to minimize the difference index of refraction between the lower index region 104, 106 and the high index central region.

The side of the first reflector 140 that is not coupled to the cavity 130 is etched in a ring shape to a depth of $h_m$ to leave a mesa 145 along the central axis 102 that is narrower in diameter than the unetched first reflector 140. In one implementation, the depth $h_m$ is greater than 4 to 5 semiconductor layer pairs. The diameter of the mesa 145 is $d_{mesa}$ is less than the diameter of the oxide aperture $d_{ox}$ 143. Because the mesa 145 has more semiconductor layer pairs than the surrounding region, the reflectivity of the combination of the mesa 145 and the first reflector 140 is higher than the surrounding portion, comprising just the semiconductor layer pairs of the first reflector 140, thus creating a higher Q cavity in the region in line with the mesa 145, and a lower Q cavity in the surrounding region. If the size of $d_{mesa}$ is sufficiently small, approximately three microns, then only the mode that matches the size of $d_{mesa}$ experiences a large enough cavity Q to lase. In other words, the VCSEL structure is a loss-guided structure where the difference in reflectivity in the central region and the surrounding region controls which mode lases in the structure. Additionally, the mesa 145 results in a spatial refractive index step that optically guides the single transverse mode. The oxide layer 142 can also produce a refractive index step that guides the single transverse mode. While the mode 170 shown in FIG. 1 is the fundamental mode, the single transverse mode at which the VCSEL is made to lase does not have to be the fundamental mode.

Although the VCSEL structure can be made to lase in single transverse mode, there are still two degenerate polarizations supported by the structure. In some implementations, a grating or a sub-wavelength grating can be etched in the top of the mesa 145 or etched in a layer of dielectric material deposited on the mesa 145 to reflect a single polarization more strongly and, thus, lock in that polarization.

A first ohmic contact 150 is positioned over the first reflector 140 and the mesa 145. A ring-shaped intra-cavity second ohmic contact 151 can be positioned in the surrounding region on top of the second reflector 120. The ohmic contacts 150, 151 can be made of layers of, but not limited to, titanium, platinum and gold. Current is injected via the ohmic contact 150, causing holes to be injected into the quantum wells 132 from the p-doped first reflector 140 and electrons to enter the quantum wells 132 from the n-doped second reflector 120. The holes and electrons recombine within the quantum wells 132 to generate light. The VCSEL 100 is bottom-emitting because light is emitted through the second reflector 120 since the second reflector 120 has a lower reflectivity than the first reflector 140. The light subsequently passes through the substrate 110, as the material of the substrate 110 is selected to be transparent to the lasing wavelength of the VCSEL. In an alternate embodiment, the substrate 110 is selected to be semi-transparent.

A bottom-emitting VCSEL laser has many advantages. Because flip chip connections can be used with a bottom-emitting VCSEL, wire bonding is not needed, and as a result, there is better signal integrity between laser driver circuits and the VCSEL. Further, the substrate surface that is not coupled to the second reflector 120 can be etched and formed into a lens shape to act upon the light emitted by the VCSEL. The lens of the substrate is integrated with the VCSEL structure, thus eliminating the need to actively align an external lens to the output of the VCSEL.

Figure 2:
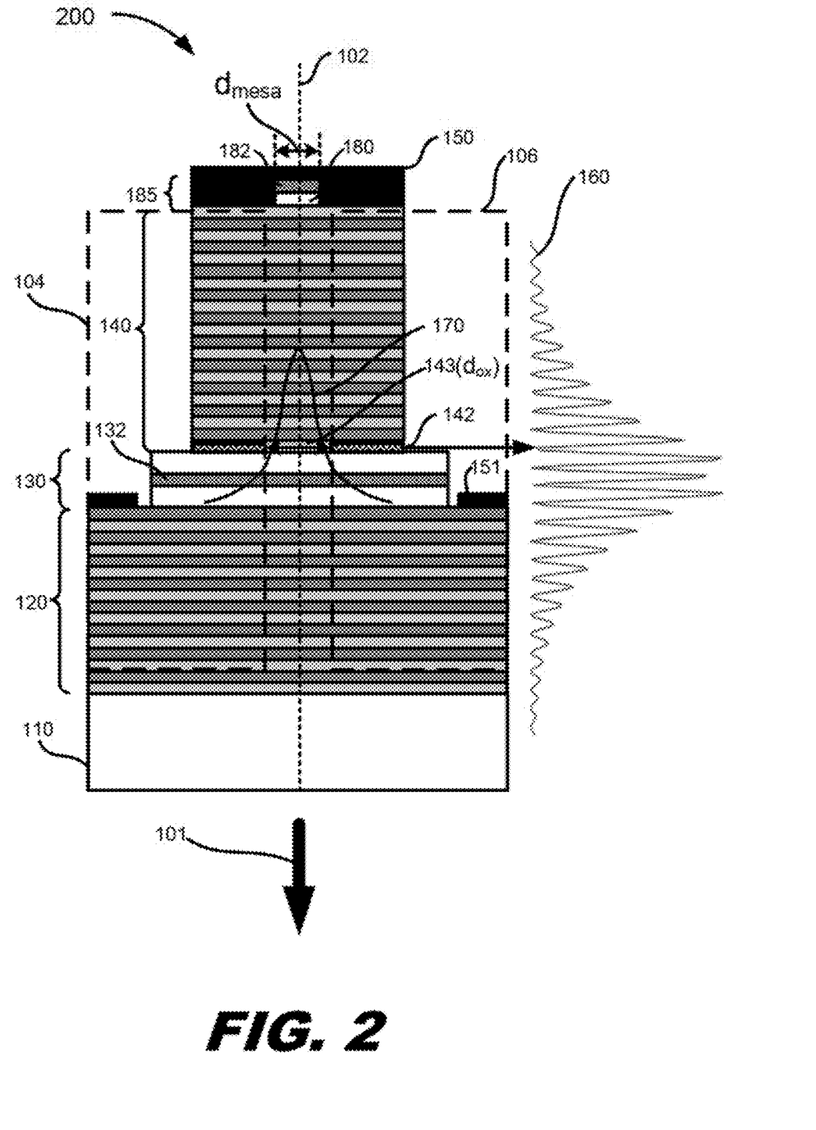
FIG. 2 depicts a cross-sectional view of another example single transverse mode VCSEL, according to one implementation of the disclosure.

FIG. 2 depicts a cross-sectional view of another example single transverse mode VCSEL 200, according to one implementation of the disclosure. Similar to the VCSEL 100 previously described, VCSEL 200 also has a p-doped first reflector 140 and an n-doped second reflector 120, where the reflectors are both DBRs. However, in this case, the first reflector 140 has many fewer semiconductor laser pairs than the second reflector 120 so that it functions as a poor reflector. In fact, the reflectivity of the first reflector 140 can be so low that without additional reflectors, to be described below, the VCSEL would not lase.

To make the VCSEL lase in a single transverse mode, a high reflectivity mesa 185 is created in the central region of the VCSEL 200 with a layer of low refractive index dielectric 180, such as, but not limited to, $SiO_2$, Al(x)O(y), $Si_3N_4$, a polymer, positioned over the first reflector 140, where the refractive index of the dielectric is lower than that of the semiconductor layer pairs in the first reflector 140. The thickness of the dielectric layer 180 should be selected so that the threshold gain for lasing is lowest. In some cases, the thickness for a low threshold gain is close to a quarter wavelength thick, and the thickness for a high threshold gain is close to half a wavelength thick, with intermediate thicknesses yielding intermediate threshold gains. Then a metallic layer 182, such as gold, is positioned over the low refractive index dielectric layer 180. The metallic layer 182 is not limited to a single metal reflector layer; it can be a metal stack, for example Ti/Au and Cr/Au. The quarter wavelength thick low refractive index dielectric layer 180 and the metallic layer 182 make up the mesa 185. Because the reflectivity of the metallic layer is high, in combination with the first reflector 140 and the quarter wavelength thick low refractive index dielectric layer 180, the reflectivity of the center region should be equivalent to a high number of pairs of semiconductor layers in the DBR of the first reflector 140 alone. However in some instances, a DBR made of alternating layers of quarter wavelength thick dielectric materials, such as $SiO_2$ and $TiO_2$ can be used to enhance the reflectivity of the mesa 186. The approximately quarter wavelength thick dielectric layer 180 in combination with the metallic layer 182 has higher reflectivity compared to the metallic layer 182 alone. This property enables the use of lower cost and lower reflectivity metallic layer 182 such as but not limited, to Ti, Pt, and Al.

A first ohmic contact 150 is positioned over the first reflector 140 and the mesa 185. A ring-shaped intra-cavity second ohmic contact 151 can be positioned in the surrounding region on top of the second reflector 120. As with the example of FIG. 1, current is injected via the ohmic contact 150. However, because the low refractive index dielectric layer 180 is an insulator, the current is injected in a ring region around the perimeter of the mesa 185. Although current can diffuse into the region near the central axis 102, it would be beneficial to have the injected current overlap with the region where the optical mode intensity is largest, near the central region of the VCSEL.

As an alternative to the low refractive index dielectric layer 180, a transparent conductive oxide or a transparent conductive nitride can be positioned directly on the top semiconductor layer of the first reflector 140. Because the transparent conductive oxide or nitride is electrically conducting, current injected through the ohmic contact 150 will allow current to be injected directly into the central region of the mesa 185 comprising the transparent conductive oxide or nitride.

Any combination of the above elements can be used to form the central region of the VCSEL structure closest to the central axis 102 to create a region that has a higher reflectivity than the surrounding region. The central region can include one or more elements selected from the group comprising: one or more pairs of semiconductor layers forming a distributed Bragg reflector, one or more pairs of dielectric layers forming a distributed Bragg reflector, one or more pairs of transparent conductive layers forming a distributed Bragg reflector, a non-conductive dielectric layer, transparent conductive oxide layer, a transparent conductive nitride layer, and a metallic layer. For example, the central region can be made of a DBR with dielectric layers and a metallic layer with a DBR with semiconductor layers.

Further, by reducing the number of semiconductor layer pairs in the first reflector 140, the ohmic contact 150 is closer to the heat generated inside the cavity 130. Thus, the thermal conductivity from the VCSEL to the ohmic contact 150 is increased and is able to more effectively extract heat from the structure. Additionally, with fewer semiconductor layer pairs in the first reflector 140, the electrical resistance of the structure is reduced, resulting in a lower VCSEL resistance and faster time constant so that the VCSEL output can be modulated at a faster rate.

As in the example of FIG. 1, the diameter, $d_{mesa}$, of the mesa 185 is smaller than the diameter of the oxide aperture, $d_{ox}$, 143, such that only the mode that matches the size of $d_{mesa}$ experiences a large enough cavity Q to lase.

As with the example of FIG. 1, a sub-wavelength grating can also be created in the central region to lock the polarization.

Figure 3:
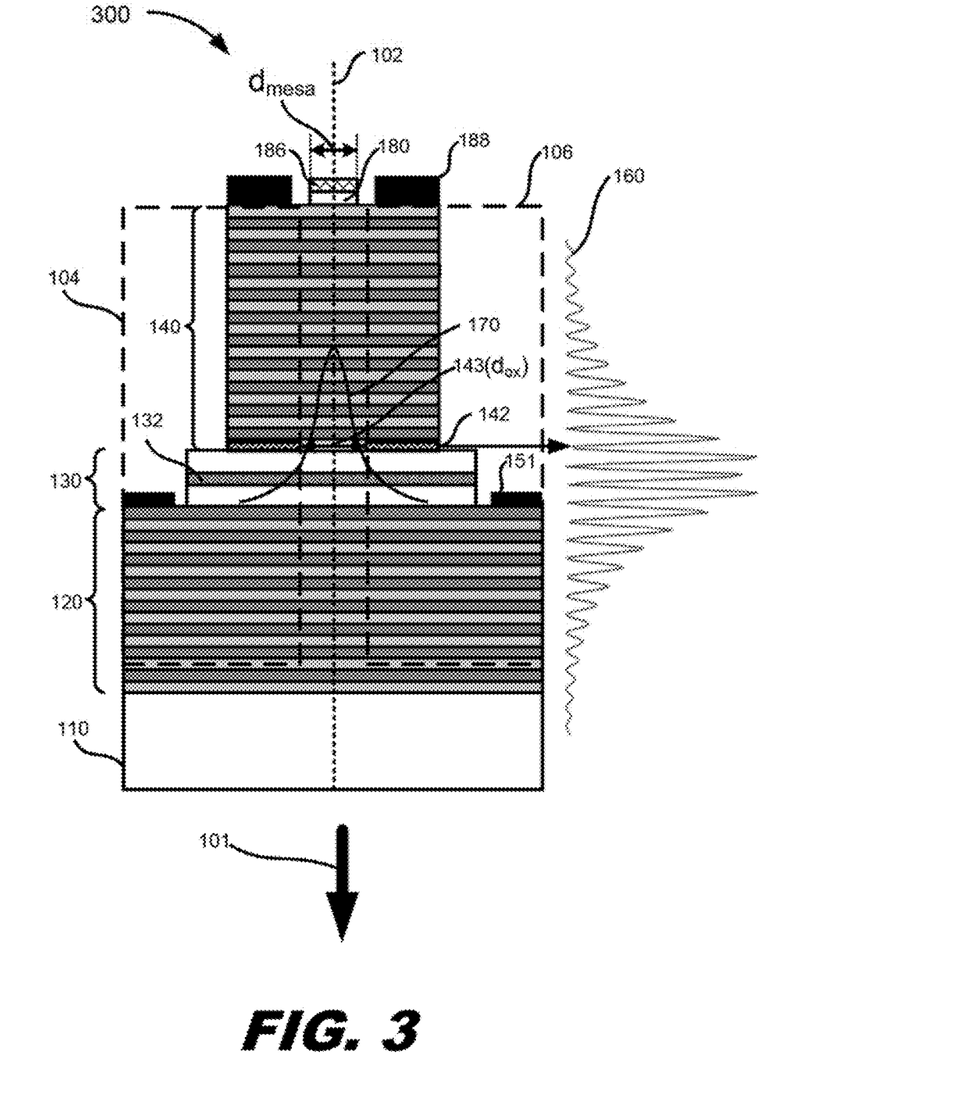
FIG. 3 depicts a cross-sectional view of another example single transverse mode VCSEL, according to one implementation of the disclosure.

FIG. 3 depicts a cross-sectional view of another example single transverse mode VCSEL 300, according to one implementation of the disclosure. Similar to the VCSEL 100 previously described, VCSEL 300 also has a p-doped first reflector 140 and an ft-doped second reflector 120, where the reflectors are both DBRs. As with the example VCSEL shown in FIG. 2, the structure of VCSEL 300 has a reduced number of semiconductor layer pairs in the DBR of the first reflector 140. Situated in the central region near the central axis 102 is a layer of low refractive index dielectric 180. A layer of high index material 186, such as, but not limited to, amorphous silicon or amorphous GaAs, is positioned on top of the dielectric layer 180. The high index material layer 186 is etched to form a sub-wavelength grating, also called a high contrast grating, that has a high reflectivity and preferentially provides more gain to one of the degenerate polarization modes of the single transverse mode that lases to lock the polarization. The high index material layer 186 replaces the metallic layer 182 of the VCSEL 200 shown in the example of FIG. 2.

The grating etched in the high index material 186 can be uniform across the central region or non-uniform. A uniform grating creates a uniform reflectivity. The grating can be tailored to provide more reflectivity in certain sections of the central region. For example, if the single transverse mode selected to lase is not the fundamental mode, but the second order mode, the reflectivity of the grating can be designed to have a lower reflectivity in the middle, and a higher reflectivity in a ring around the central axis 102. The lower reflectivity in the middle will force the lowest order, or fundamental mode, to have a higher gain threshold, while the higher reflectivity in a ring configuration will match the doughnut-shaped intensity profile of the second order mode, to lower the gain threshold, and result in lasing of the second order mode, rather than the fundamental mode. The advantage to lasing in the second order mode is that it has a larger mode volume and can emit more power. The reflectivity of the grating can be tailored to match any selected mode profile.

Because the reflectivity of the etched grating can be very high, the number of semiconductor layer pairs in the DBR of the first reflector can be reduced. In some cases, no semiconductor layer pairs are present.

A ring-shaped ohmic contact 188 is positioned above the first reflector layer 140.

Figure 4A:
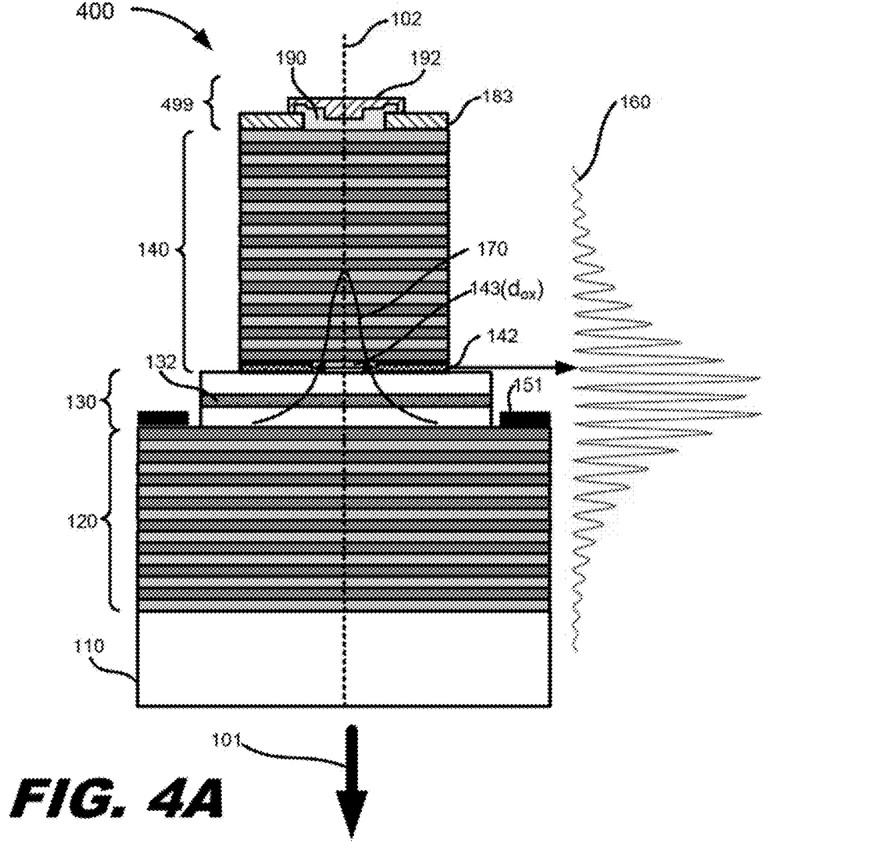
FIG. 4A depicts a cross-sectional view of another example single transverse mode VCSEL, according to one implementation of the disclosure.
Figure 4B:
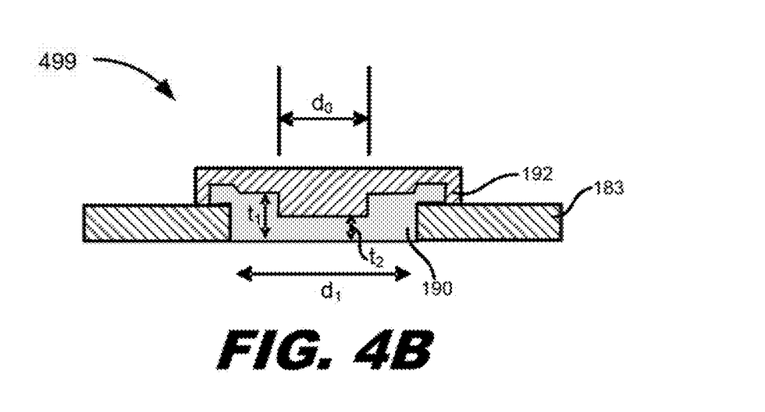
FIG. 4B is an expanded view of a top portion of the example single mode VCSEL shown in FIG. 4A.

FIG. 4A depicts a cross-sectional view of another example single transverse mode VCSEL 400, according to one implementation of the disclosure. FIG. 4B is an expanded view of a top portion 499 of the example single mode VCSEL 400. Similar to the VCSEL 100 previously described, VCSEL 400 also has a p-doped first reflector 140 and an n-doped second reflector 120, where the reflectors are both DBRs. An additional layer 190 is positioned on top of the first reflector 140 in the central region around the central axis 102. The additional layer 190 comprises at least one of: a dielectric material, a transparent conductive oxide, a transparent conductive nitride, or a polymer. The additional layer 190 can be etched to produce a radially dependent reflectivity across the central region to match the profile of the desired single mode for lasing, similar to tailoring the reflectivity of the grating in the high index material 186 for the VCSEL 300 shown in the example of FIG. 3.

As shown in FIG. 4B the additional layer 190 has a thickness $t_2$ in a region near the central axis 102 with a diameter $d_0$, and a different thickness $t_1$ in a region surrounding the central region with an outer diameter $d_1$. The tailored thicknesses in the additional layer 190 can be created using a digital etching or gray-scale lithography technique.

For a reflectivity of the additional layer 190 to match a fundamental mode with an intensity profile having a peak in the center, the reflectivity of the central region with the thickness $t_2$ should be higher than the reflectivity of the surrounding region with the thickness $t_1$. In this configuration, the central region with thickness $t_2$ will be the reflector for a cavity with a higher Q, while the surrounding region with thickness $t_1$ will be the reflector for a cavity with a lower Q. Using $SiO_2$ as the material for the additional layer 190, the thickness $t_2$ should be approximately a quarter of a wavelength thick, and the thickness $t_1$ should be approximately half of a wavelength thick. The diameter $d_0$ should be less than the diameter of the oxide aperture $d_{ox}$ 143 for the VCSEL to lase in a single mode. However, the diameter $d_1$ can be larger than $d_{ox}$.

As seen in both FIGS. 4A and 4B, a first metallic reflector layer 192 is deposited on top of the additional layer 190, where the first metallic reflector layer 192 is anchored to a ring-shaped ohmic contact 183. The metallic layer 192 is not limited to a single metal reflector layer; it can be a metal stack.

Figure 5A:
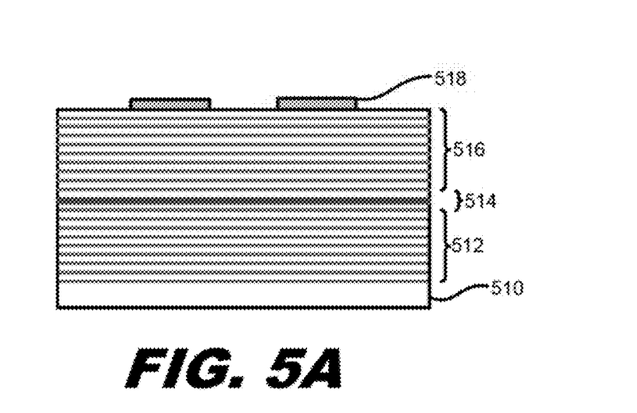
FIGS. 5A-5E depict cross-sectional views of an example single transverse mode VCSEL as it is created during an example fabrication process.
Figure 5B:
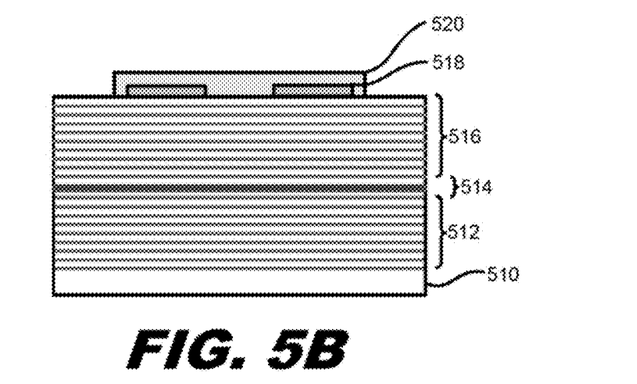
Figure 5C:
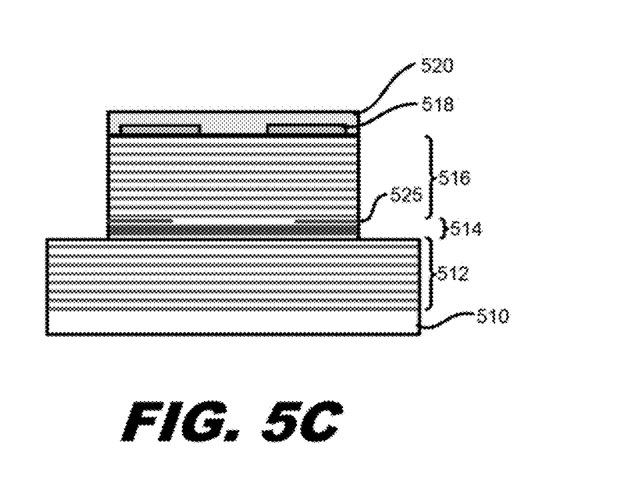
Figure 5D:
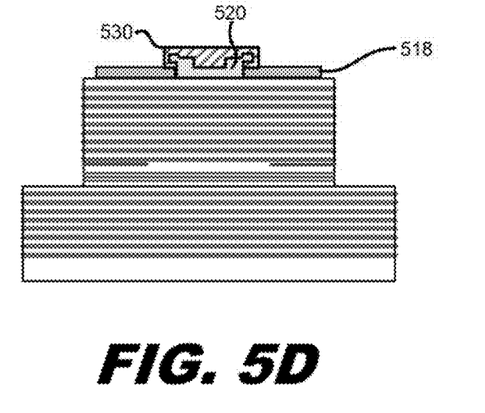
Figure 5E:
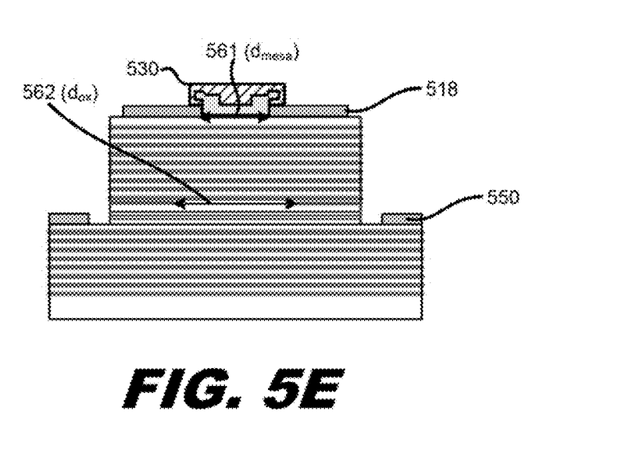
Figure 6A:
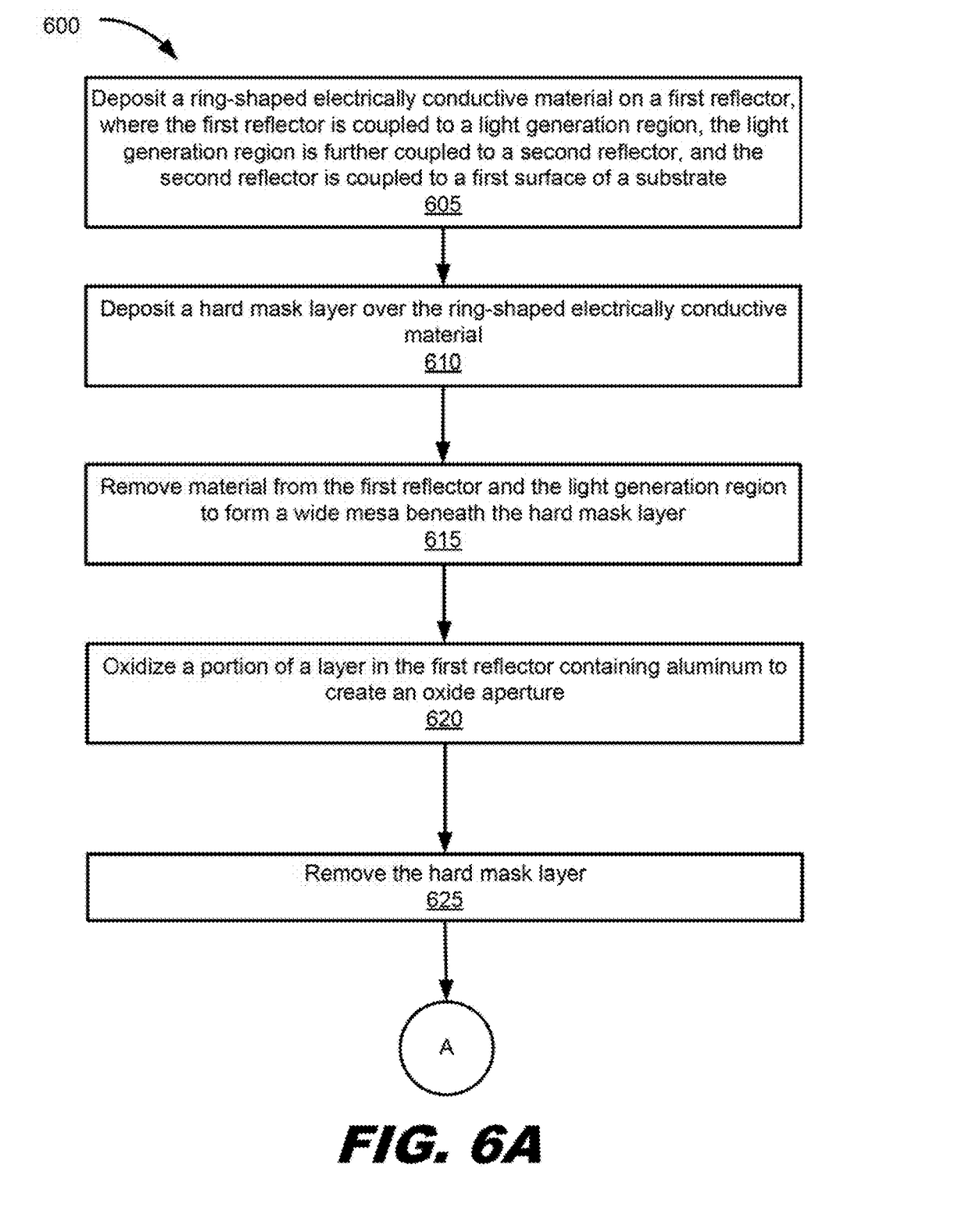
FIGS. 6A and 6B depict a flow diagram illustrating an example process of fabricating the single transverse mode VCSEL depicted in FIG. 2.
Figure 6B:
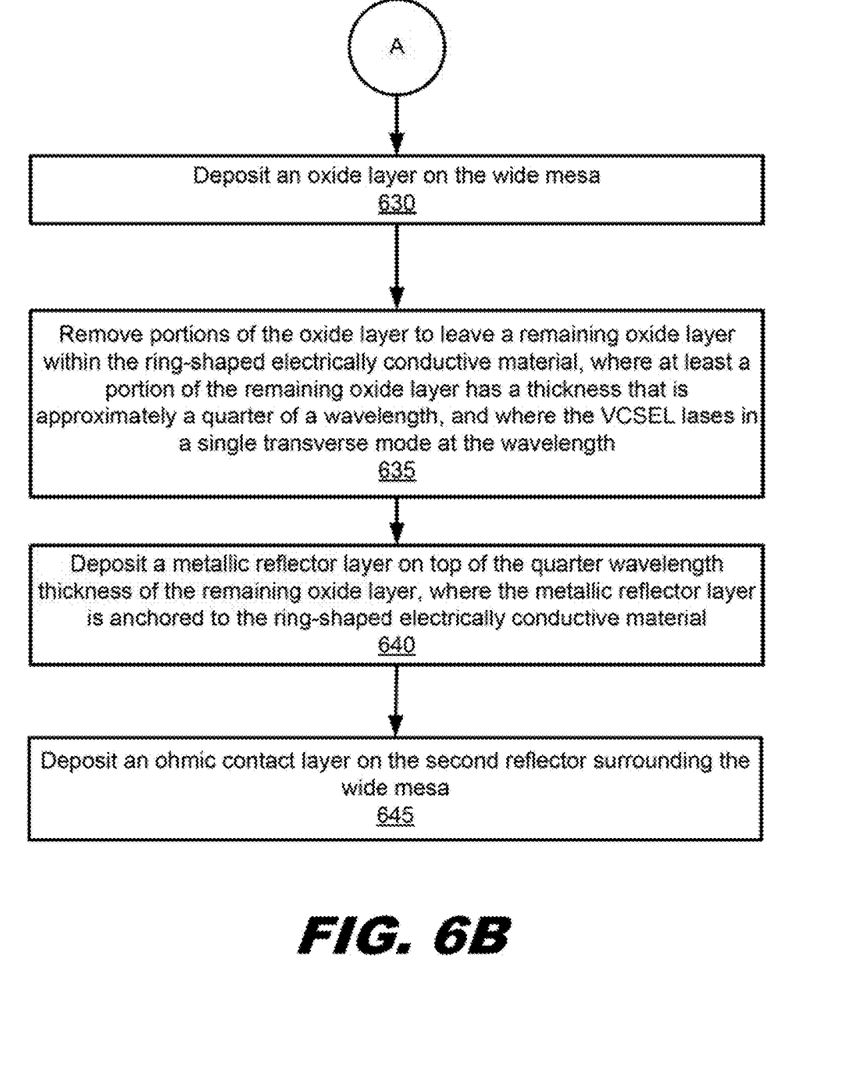

FIGS. 6A and 6B depict a flow diagram 600 illustrating an example process of fabricating the single mode VCSEL 400 depicted in the example of FIG. 4A. Cross-sectional views of the device during various stages of fabrication are shown in the examples of FIGS. 5A-5E.

FIG. 5A shows a portion of the single mode VCSEL 400. A first reflector 516 is coupled to a light generation region within a cavity 514, the light generation region is further coupled to a second reflector 512, and the second reflector 512 is coupled to a first surface of the substrate 510.

At block 605, a ring-shaped electrically conductive material 518 is deposited on the first reflector 516. The electrically conductive material can be titanium, platinum, and gold.

Then at block 610, a hard mask layer 520 is deposited over the ring-shaped electrically conductive material 518, as shown in the FIG. 5B. The hard mask layer 520 is a low refractive index dielectric material, such as $SiO_2$, and is used to define the edges of the first reflector 516.

Next, at block 615, materiel is removed from the first reflector 516 and the light generation region 514 to form a wide mesa beneath the hard mask layer 520, as shown in the example of FIG. 5C. The material is removed through dry etching.

At block 620, the structure is placed in a steam environment at elevated temperatures to oxidize a portion of a semiconductor layer 525 that contains aluminum. The oxidation reaction starts at the perimeter of the layer and moves inward to create the oxide aperture. Then at block 625, the hard mask layer 520 is removed.

At block 630, an oxide layer is deposited on the wide mesa of the first reflector 516, and at block 635, portions of the oxide layer are removed to leave a remaining oxide layer 520 within the ring-shaped electrically conductive material 518, where at least a portion of the remaining oxide layer has a thickness that is approximately a quarter of a wavelength, and the VCSEL lases in a single transverse mode at the wavelength, where the single transverse mode is the fundamental mode.

To force the VCSEL to lase at the fundamental mode the remaining oxide layer is etched to have a first thickness that is approximately half of the wavelength in a ring shape adjacent to the ring-shaped electrically conductive material 518, and a second thickness that is approximately a quarter of the wavelength near a center of the ring-shaped electrically conductive material 518. Additionally, a diameter of the remaining oxide layer that has the second thickness is less than the inner diameter of the oxide aperture.

Next, at block 640, a metallic reflector layer 530 is deposited on top of the quarter wavelength thickness of the remaining oxide layer 520, where the metallic reflector layer 530 is anchored to the ring-shaped electrically conductive material 518, as shown in the example of FIG. 5D. The metallic reflector layer 530 is not limited to a single metal reflector layer; it can be a metal stack.

Then at block 645, an ohmic contact layer 550 is deposited on the second reflector 512 surrounding the wide mesa of the first reflector 516, as shown in the example of FIG. 5E. Note that the diameter $d_{mesa}$ 561 of the hard mask layer 520 is smaller than the diameter of the oxide aperture $d_{ox}$ 562 to produce a VCESL that lases in a single transverse mode.

Not all of the steps, or features presented above are used in each implementation of the presented techniques. Further, steps in process 600 can be performed in a different order than presented. The description given in FIGS. 5A-5E and process 600 are for the purpose of illustration, and it will be apparent to those skilled in the art that other fabrication steps and approaches are possible and fall within the scope of the disclosure.

What is claimed is:

1. A vertical-cavity surface-emitting laser (VCSEL) comprising:
   a first reflector having a first reflectivity;
   a radially-dependent mesa layer above the first reflector having a central point aligned with a central axis;
   one or more metallic layers above the radially-dependent mesa layer;
   a second reflector having a second reflectivity, wherein the second reflectivity is less than the first reflectivity;
   a light generation region between the first and second reflectors;
   an oxide layer having an aperture with an aperture diameter in a central area of the oxide layer; and
   a substrate having a first surface and a second surface, wherein the first surface is coupled to the second reflector, and wherein the second surface is formed into a lens shape to act upon light emitted by the VCSEL through the substrate,
   wherein the VCSEL lases in a single transverse mode,
   wherein the aperture in the oxide layer has a higher refractive index than the surrounding oxide layer; the oxide layer is located at or near a null of a standing wave in the VCSEL; and a center of the oxide layer is approximately aligned with the central axis of the first reflector, the light generation region, the second reflector, and the substrate,
   wherein the radially-dependent mesa layer comprises at least one of: a dielectric material, a transparent conductive oxide, a transparent conductive nitride, or a polymer,
   wherein the radially-dependent mesa layer has a first thickness that is approximately a quarter of the VCSEL lasing wavelength within a first region having a first diameter around the central axis, and the radially-dependent mesa layer has a second thickness that is approximately half of the VCSEL lasing wavelength in a second region surrounding the first region,
   wherein the first reflector comprises multiple pairs of semiconductor layers forming a distributed Bragg reflector, and
   further wherein the first diameter of the first region is less than the aperture diameter.

2. The VCSEL of claim 1, wherein the first reflector is a distributed Bragg reflector and comprises a first number of pairs of semiconductor layers in a central region of the first reflector and a second number of pairs of semiconductor layers in an outer region surrounding the central region, wherein the first number of pairs is greater than the second number of pairs, and further wherein the central region has a reflector diameter less than the aperture diameter, and the central portion has a higher reflectivity than the outer region surrounding the central region.

3. The VCSEL of claim 1, wherein the first reflector has a central region and an outer region surrounding the central region, and wherein the outer region of the first reflector comprises multiple pairs of semiconductor layers forming a distributed Bragg reflector, and wherein the central region of the first reflector includes one or more elements selected from the group comprising: one or more pairs of semiconductor layers forming a distributed Bragg reflector, one or more pairs of dielectric layers forming a distributed Bragg reflector, one or more dielectric layers, a transparent conductive oxide layer, a transparent conductive nitride layer, a polymer, and one or more metallic layers, wherein a reflectivity of the central region is greater than a reflectivity of the outer region, and further wherein the central region has a reflector diameter less than the aperture diameter.

4. The VCSEL of claim 1, further comprising a high contrast grating positioned over the central region of the first reflector, wherein the first reflector comprises multiple pairs of semiconductor layers forming a distributed Bragg reflector, and further wherein a diameter of the high contrast grating is less than the aperture diameter.

5. A method for fabricating a single transverse mode VCSEL comprising:
  depositing a ring-shaped electrically conductive material on a first reflector, wherein the first reflector is coupled to a light generation region, the light generation region is further coupled to a second reflector, and the second reflector is coupled to a first surface of a substrate;
  depositing a hard mask layer over the ring-shaped electrically conductive material;
  removing material from the first reflector and the light generation region to form a wide mesa beneath the hard mask layer;
  oxidizing a portion of a layer in the first reflector containing aluminum to create an oxide aperture; and
  depositing an ohmic contact layer on the second reflector surrounding the wide mesa,
  wherein an improvement comprises:
    removing the hard mask layer;
    depositing an oxide layer on the wide mesa;
    removing portions of the oxide layer to leave a remaining oxide layer within the ring-shaped electrically conductive material, wherein at least a portion of the remaining oxide layer has a thickness that is approximately a quarter of a wavelength, and further wherein the VCSEL lases in a single transverse mode at the wavelength; and
    depositing a metallic reflector layer on top of the quarter wavelength thickness of the remaining oxide layer, wherein the metallic reflector layer is anchored to the ring-shaped electrically conductive material.

6. The method of claim 5, wherein the metallic reflector layer is a metal stack.

7. The method of claim 5, further comprising fabricating a lens on a second surface of the substrate, wherein light emitted by the single mode VCSEL is emitted through the lens.

8. The method of claim 5, further comprising placing a high contrast grating under the metallic reflector layer.

9. The method of claim 5, wherein the remaining oxide layer has a first thickness that is approximately half of the wavelength in a ring shape adjacent to the ring-shaped electrically conductive material, and a second thickness that is approximately a quarter of the wavelength near a center of the ring-shaped electrically conductive material.

10. The method of claim 9, wherein a diameter of the remaining oxide layer that has the second thickness is less than the inner diameter of the oxide aperture.

* * * * *